(12) United States Patent
Suzumura et al.

(10) Patent No.: US 10,580,801 B2
(45) Date of Patent: Mar. 3, 2020

(54) DISPLAY DEVICE AND MANUFACTURING METHOD THEREOF

(71) Applicant: Japan Display Inc., Minato-ku (JP)

(72) Inventors: Isao Suzumura, Minato-ku (JP); Hajime Watakabe, Minato-ku (JP); Akihiro Hanada, Minato-ku (JP); Hirokazu Watanabe, Minato-ku (JP); Yohei Yamaguchi, Minato-ku (JP); Marina Shiokawa, Minato-ku (JP); Ryotaro Kimura, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/978,464

(22) Filed: May 14, 2018

(65) Prior Publication Data

US 2018/0342536 A1 Nov. 29, 2018

(30) Foreign Application Priority Data

May 29, 2017 (JP) .................................. 2017-105791

(51) Int. Cl.
*G02F 1/1343* (2006.01)
*G02F 1/1368* (2006.01)
(Continued)

(52) U.S. Cl.
CPC .......... *H01L 27/124* (2013.01); *G02F 1/1368* (2013.01); *G02F 1/133305* (2013.01);
(Continued)

(58) Field of Classification Search
CPC .. G02F 1/136; G02F 1/1368; G02F 1/136286; G02F 1/134363;
(Continued)

(56) References Cited

U.S. PATENT DOCUMENTS 6,534,788 B1 * 3/2003 Yeo .................... H01L 29/41733
257/66
8,199,269 B2 * 6/2012 Hattori ................ H01L 27/1214
349/43

(Continued)

FOREIGN PATENT DOCUMENTS

JP 2006-222433 8/2006
JP 2008-281986 11/2008

*Primary Examiner* — Thoi V Duong
(74) *Attorney, Agent, or Firm* — Oblon, McClelland, Maier & Neustadt, L.L.P.

(57) ABSTRACT

The purpose of the invention is to form a flexible display device where the substrate is made of resin, wherein the TFT can be annealed in high temperature; consequently, a reliability of the TFT is improved. The concrete measure is as follows. A display device having a pixel electrode and a TFT including a semiconductor layer on a substrate comprising: a source region of the semiconductor layer connects with a source electrode, a drain region of the semiconductor layer connects with a drain electrode; the pixel electrode connects with the source electrode; the drain electrode connects with a video signal line; a distance between the drain electrode and the substrate is smaller than a distance between the semiconductor and the substrate, the semiconductor layer is formed between the pixel electrode and the substrate.

11 Claims, 21 Drawing Sheets

(51) Int. Cl.
  *G02F 1/1362* (2006.01)
  *G02F 1/1337* (2006.01)
  *H01L 27/12* (2006.01)
  *H01L 29/786* (2006.01)
  *G02F 1/1333* (2006.01)
  *H01L 27/32* (2006.01)

(52) U.S. Cl.
  CPC .. *G02F 1/134363* (2013.01); *G02F 1/136209* (2013.01); *G02F 1/136227* (2013.01); *G02F 1/136286* (2013.01); *H01L 27/127* (2013.01); *H01L 27/1218* (2013.01); *H01L 27/1266* (2013.01); *H01L 27/3248* (2013.01); *H01L 27/3262* (2013.01); *H01L 29/78603* (2013.01); *H01L 29/78618* (2013.01); *H01L 29/78633* (2013.01); G02F 2001/136295 (2013.01); G02F 2202/104 (2013.01); H01L 27/1225 (2013.01); H01L 29/7869 (2013.01); H01L 29/78648 (2013.01); H01L 29/78678 (2013.01)

(58) Field of Classification Search
  CPC ......... G02F 1/133345; G02F 1/133512; G02F 1/133514; G02F 1/136227; G02F 1/1337; G02F 1/134309; G02F 1/134336; G02F 1/133723; G02F 1/133305; G02F 1/136209; G02F 1/1343; G02F 1/133707; G02F 1/1333; G02F 1/133711; G02F 1/1362; G02F 1/133509; G02F 2001/134372; G02F 2001/13685; G02F 2001/133357; G02F 2001/133519; G02F 2001/134318; G02F 2001/13629; G02F 2202/104; G02F 2202/02; G02F 2202/10; G02F 2201/124; G02F 2201/52; H01L 27/124; H01L 27/1225; H01L 27/1218; H01L 27/1248; H01L 27/3262; H01L 27/127; H01L 27/3276; H01L 27/1251; H01L 27/1266; H01L 27/3248; H01L 27/3272; H01L 29/7869; H01L 29/78648; H01L 29/4908; H01L 29/78603; H01L 29/78633; H01L 29/78693; H01L 21/02565; H01L 29/78618; H01L 29/78678; G09G 2300/0426; G09G 3/3648; G09G 3/3677; Y10T 428/1023; Y10T 428/10; B32B 7/06; C09D 179/08
  See application file for complete search history.

(56) References Cited

U.S. PATENT DOCUMENTS

| | | | |
|---|---|---|---|
| 8,994,904 B2* | 3/2015 | Jiroku | G02F 1/136227 349/113 |
| 9,646,829 B2* | 5/2017 | Ohno | H01L 21/02554 |
| 9,806,197 B1* | 10/2017 | Yoshiga | H01L 27/1222 |
| 2004/0159837 A1 | 8/2004 | Inoue | |
| 2014/0140015 A1* | 5/2014 | Choi | H01L 51/0097 361/748 |

* cited by examiner

DISPLAY DEVICE AND MANUFACTURING METHOD THEREOF

CLAIM OF PRIORITY

The present application claims priority from Japanese Patent Application JP 2017-105791 filed on May 29, 2017, the content of which is hereby incorporated by reference into this application.

BACKGROUND OF THE INVENTION

(1) Field of the Invention

The present invention relates to a display device, specifically to a flexible display device that has a resin substrate as polyimide and has active elements of high reliability.

(2) Description of the Related Art

A liquid crystal display device has a TFT substrate, a counter substrate opposing to the TFT substrate and a liquid crystal layer sandwiched between the TFT substrate and the counter substrate. The TFT substrate has plural pixels; each of the pixels has a pixel electrode and a thin film transistor (TFT). A transmittance of light in each pixel is controlled by liquid crystal molecules; thus, images are formed.

Certain liquid crystal display devices are required to be flexible using resin for the substrates. Forming TFTs on the substrate of resin, however, there arises a problem regarding heat resistance of the substrate.

The patent document 1 (Japanese patent laid open 2008-281986) discloses to form a driving circuits on the glass substrate; then to transfer the driving circuit on the flexible substrate formed by resin; after that elements for display are formed on the driving circuit. The patent document 2 (Japanese patent laid open 2006-222433) discloses a display device that forms images by controlling micro capsules, which include electrophoretic ink. The patent document 2 (Japanese patent laid open 2006-222433) discloses the pixel electrode made of ITO (Indium Tin Oxide) and the TFT are directly formed on the substrate; wherein the pixel electrode and the drain electrode of the TFT are directly laminated for electrical contact between them.

SUMMARY OF THE INVENTION

The flexible display device having a substrate of resin has a problem of heat resistivity in the manufacturing process. The TFT of poly-silicon needs to be annealed in high temperature. LTPS (Low Temperature Poly-Silicon) is formed from a-Si (amorphous Silicon) by applying excimer laser on the a-Si. Even in LTPS, high temperature of annealing of 400 centigrade to 450 centigrade is necessary.

The TFT of the oxide semiconductor can be formed with annealing temperature of 350° C. (herein after centigrade); however, it is preferable to anneal at temperature of 400 centigrade to 450 centigrade to improve reliability. By the way, the oxide semiconductors that are optically transparent and amorphous are called TAOS (Transparent Amorphous Oxide Semiconductor). The examples of TAOS are IGZO (Indium Gallium Zinc Oxide), ITZO (Indium Tin Zinc Oxide), ZnON (Zinc Oxide Nitride), IGO (Indium Gallium Oxide), and so on.

On the other hand, since the liquid crystal display device needs a back light for display, the substrate must be transparent. However, the heat resistivity of the transparent resin, e.g. polyimide is up to 350 centigrade.

The purpose of the present invention is to realize the flexible display device having resin substrate that can be formed through annealing of 400 centigrade to 450 centigrade in the manufacturing process.

The present invention overcomes the above explained problem; the concrete structures are as follows.

(1) A display device having a pixel electrode and a TFT including a semiconductor layer on a substrate comprising: a source region of the semiconductor layer connects with a source electrode, a drain region of the semiconductor layer connects with a drain electrode, the pixel electrode connects with the source electrode, the drain electrode connects with a video signal line; a distance between the drain electrode and the substrate is smaller than a distance between the semiconductor and the substrate, the semiconductor layer is formed between the pixel electrode and the substrate.

(2) A liquid crystal display device comprising: a first substrate having a pixel electrode and a TFT, liquid crystal, sandwiched between the first substrate and a second substrate; wherein an alignment film is formed on a surface that contacts the liquid crystal at each of the first substrate and the second substrate, the alignment film is not formed in a through hole that connects the pixel electrode and the TFT.

(3) A manufacturing method of a display device including a first substrate having a pixel electrode and a TFT including a semiconductor layer comprising: forming the pixel electrode on a second substrate, forming the semiconductor layer on a separate layer from the pixel electrode; forming the first substrate covering the semiconductor layer, after that, eliminating the second substrate.

DETAILED DESCRIPTION OF THE PREFERRED EMBODIMENTS

The present invention will be described in detail referring to the following embodiments.

First Embodiment

Figure 1:
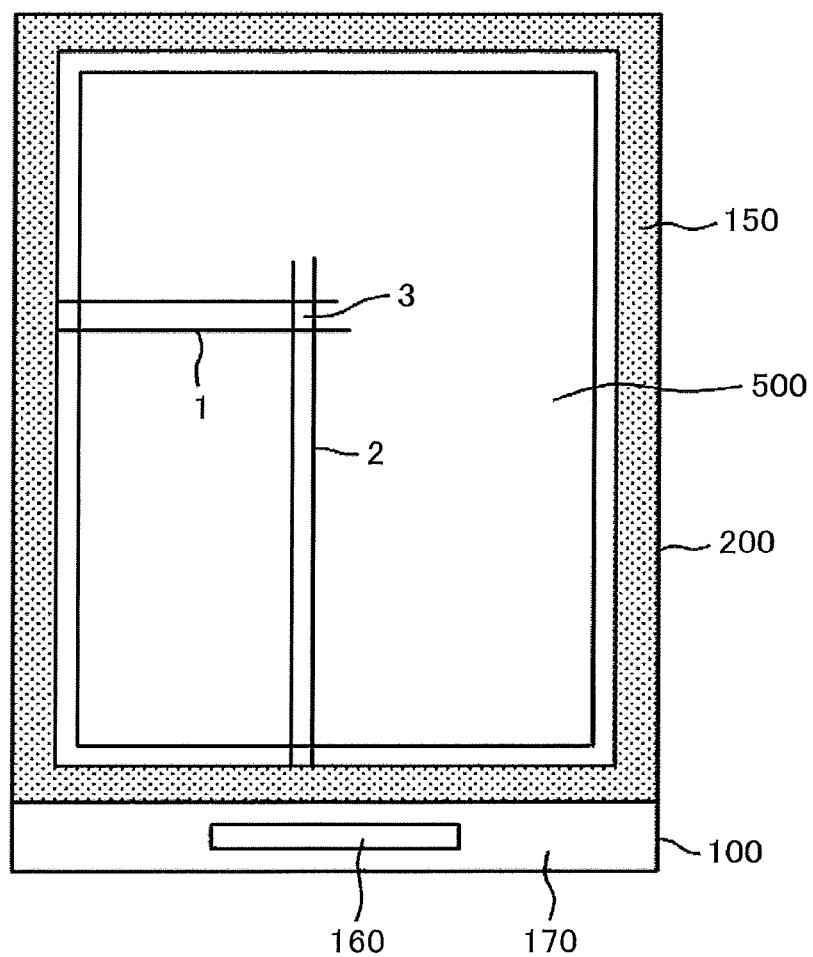
FIG. 1 is a plan view of the liquid crystal display device.

FIG. 1 is a plan view of a liquid crystal display device. FIG. 1 is an example of the flexible liquid crystal display device. In FIG. 1, the TFT substrate 100, in which the pixel electrodes and the TFTs are formed, and the counter substrate 200 adhere to each other by the sealing material 150; the liquid crystal is sealed inside. The display area 500 is formed inside of the sealing material 150.

In the display area 500, the scan lines 1 extend in lateral direction (x direction) and arranged in longitudinal direction (y direction). The video signal lines 2 extend in longitudinal direction (y direction) and arranged in lateral direction (x direction). The pixel 3 is formed in the area surrounded by the scan lines 1 and the video signal lines 2.

In FIG. 1, the TFT substrate 100, where the TFTs and the pixel electrodes are formed, is made of resin as e.g. polyimide. Polyimide has superior characteristics for the substrate of the display device because it has high heat resistivity and high mechanical strength and so on. Herein after, the resin is represented by polyimide; however, the resin is not necessarily limited to polyimide. In the meantime, the counter substrate 200 is also formed by polyimide in FIG. 1.

In FIG. 1, the TFT substrate 100 is bigger than the counter substrate 200; the portion of the TFT substrate 100 that doesn't overlap with the counter substrate 200 is the terminal area 170. The driver IC 160 is installed in the terminal area 170. Terminals are formed in the terminal area to connect a flexible wiring substrate, which supplies powers and signals to the liquid crystal display device.

Figure 2:
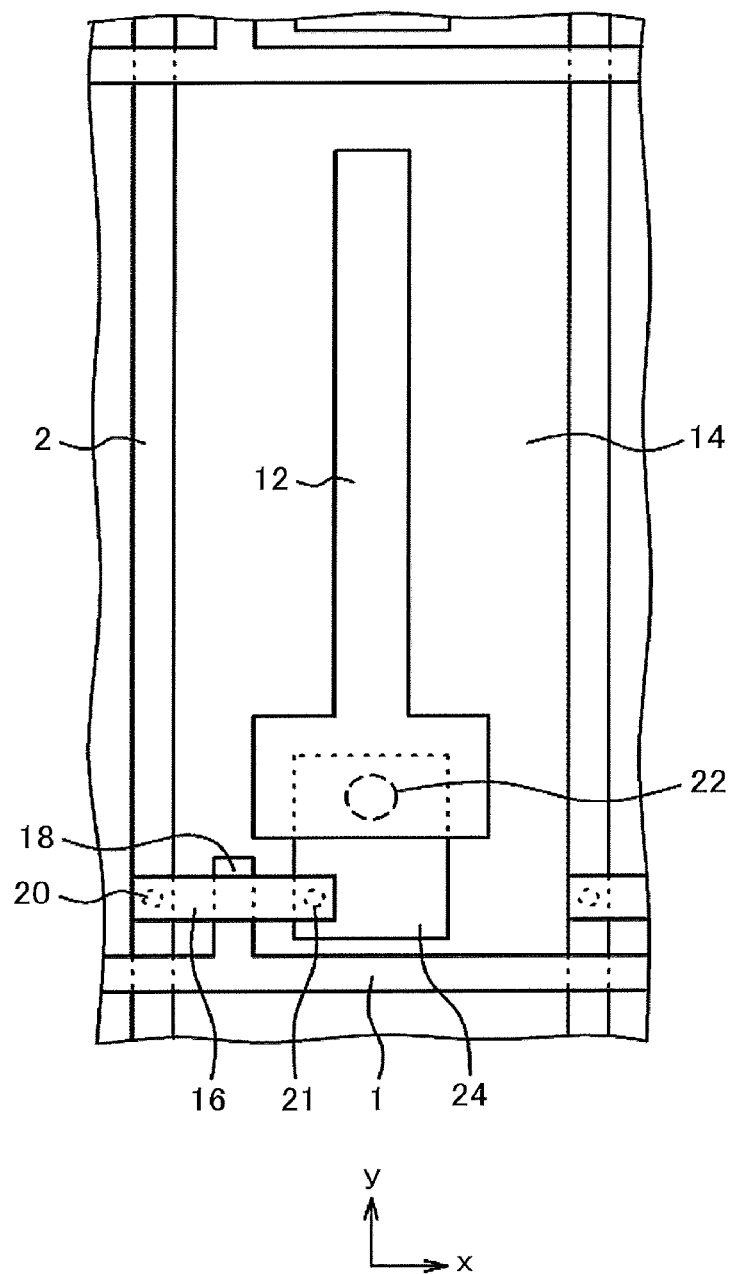
FIG. 2 is a plan view of the pixel area of the liquid crystal display device.

FIG. 2 is a plan view of the pixel in the display area 500 of the TFT substrate 100. In FIG. 2, the scan lines 1 extend in lateral direction (x direction) and arranged in longitudinal direction (y direction). The video signal lines 2 extend in longitudinal direction and arranged in lateral direction. In FIG. 2, the scan line 1 is formed on upper layer than the video signal line 2. The pixel electrode 12 and the TFT are formed in the area surrounded by the scan lines 1 and the video signal lines 2.

In FIG. 2, the active element (semiconductor layer) of the TFT is formed by LTPS 16. The video signal line 2 works as the drain electrode of the TFT; the video signal line 2 and the LTPS 16 connect via the through hole 20. Another side of the LTPS 16 connects with the source electrode 24 via the through hole 21. The source electrode 24 is formed on the same layer as the video signal line 2. In FIG. 2, the gate electrode 18 is a branch of the scan line 1.

The source electrode 24 connects with the pixel electrode 12 via the through hole 22. The pixel electrode is stripe shaped. The common electrode 14 is formed in plane shape under the pixel electrode 12 via the capacitive insulating film. The common electrode 14 is formed all over the display area 500 but the place of the through hole 22. When video signal is applied to the pixel electrode 12, a line of force is generated between the pixel electrode 12 and the common electrode 14; the line of force extends through the liquid crystal layer, thus, liquid crystal molecules are rotated, consequently optical transmittance in each of the pixels is controlled. The TFT in FIG. 2 is only an example. The TFT may be a double gate type according to products.

The dimension of the pixel in the lateral direction is as small as 30 micrometer (herein after micron) in the example of FIG. 2; thus, the pixel electrode 12 has only one stripe electrode. If the lateral dimension of the pixel is bigger, the pixel electrode 12 can be comb shaped electrode that has a slit inside. FIG. 2 is an IPS (In Plane Switching) type liquid crystal display device.

Figure 3:
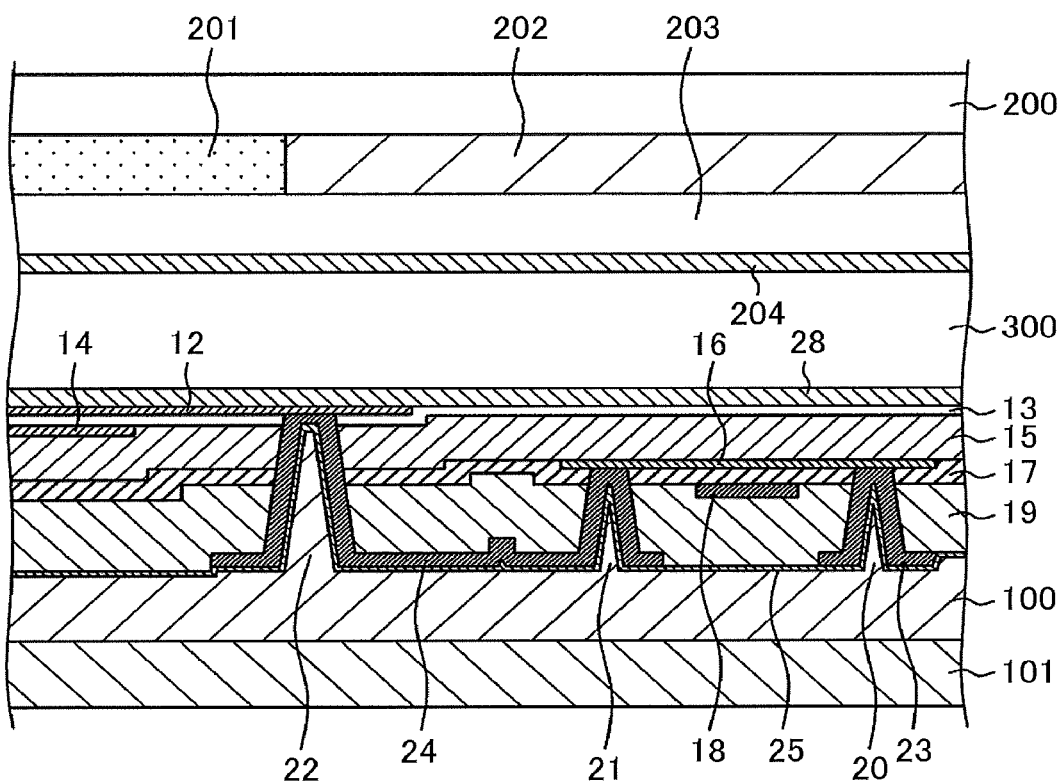
FIG. 3 is a cross sectional view of the pixel area.

FIG. 3 is a cross sectional view of the display area 500 of FIG. 1. FIG. 3 shows feature of the present invention that is very different from the cross section of a normal liquid crystal display device. Therefore, only general structure is explained in FIG. 3, the detailed structure is explained in individual manufacturing processes.

In a side of TFT substrate 100 in FIG. 3, as explained later, the structure from the pixel electrode 12 to the plastic substrate 101 is formed on the heat resistant polyimide formed on the glass substrate in the manufacturing processes; after all the layers are formed, the glass substrate and the heat resistant polyimide are removed. After that, the alignment film 28 is formed.

In FIG. 3, the color filter 201 and the black matrix 202 are formed on the inside of the counter substrate 200, which is formed by transparent polyimide. The overcoat film 203 is formed covering the color filter 201 and the black matrix 202. The role of the overcoat 203 is to prevent the pigments of the color filter 201 from contaminating the liquid crystal layer 300. The alignment film 204 is formed covering the overcoat film 203.

The liquid crystal layer 300 is sandwiched between the TFT substrate 100 and the counter substrate 200. FIG. 3 depicts an IPS type liquid crystal display device. The present invention is explained in an example of the IPS type liquid crystal display device in this specification; however, the present invention is applicable to other types of the liquid crystal display devices.

Figure 4:
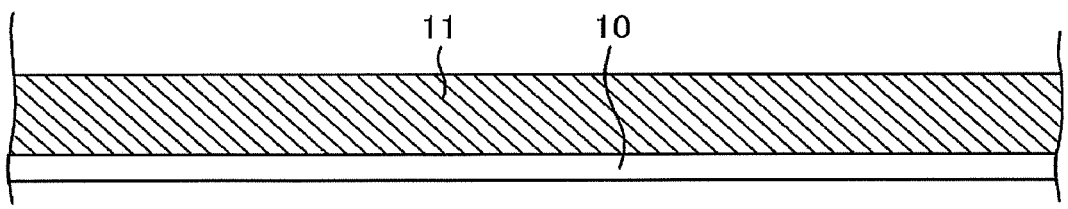
FIG. 4 is a cross sectional view that the heat resistant polyimide substrate is formed on the glass substrate.

Manufacturing processes for the structure of TFT substrate side in FIG. 3 are explained by FIGS. 4 to 20. FIG. 4 is a cross sectional view that the material for heat resistant polyimide is coated on the glass substrate 10; and the material is baked to be a heat resistant polyimide substrate 11. The heat resistant polyimide 11 can endure the temperature of 450 centigrade; however, it is colored. Therefore, the heat resistant polyimide 11 is removed in the final product. The heat resistant polyimide 11 may be called a colored polyimide in this specification.

The material for the heat resistant polyimide substrate 11 is coated by spinner, slit coater, etc. The thickness of the heat resistant polyimide substrate 11 can be approximately 2 micron. The thickness should be limited so that it can be removed by e.g. plasma ashing. The surface roughness of the heat resistant polyimide is the same as the surface roughness of the organic passivation film, which is generally works as a flattening film.

As will be explained later, the transparent polyimide substrate 100 exists in the final product. The transparent polyimide has higher transparency of light than the heat resistant polyimide; however, it can endure the heat up to 350 centigrade. As to definition of heat resistant, the heat resistant polyimide and the transparent polyimide are compared by the amount of gas discharged at e.g. 400 centigrade, wherein, the polyimide that discharges less gas is defined as the heat resistant polyimide. Another definition is that the amount of decomposition of the polyimide is compared at 400 centigrade; wherein the less decomposed polyimide can be defined as the heat resistant polyimide.

A comparison whether it is a transparent polyimide or a colored polyimide can be measured in visible light. For example, a transmittance in the green light, which has 500 nm of wave length, is compared; the polyimide of higher transmittance can be defined as a transparent polyimide.

Figure 5:
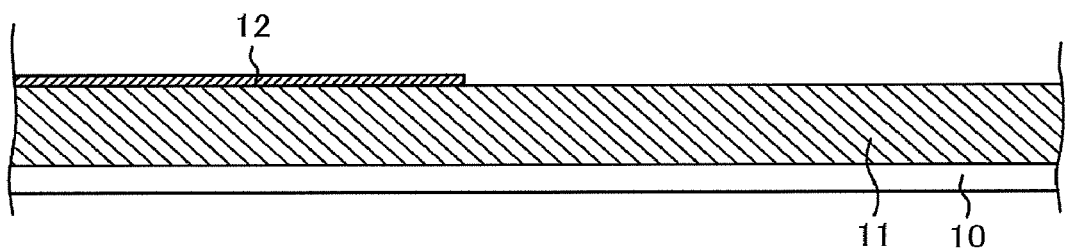
FIG. 5 is a cross sectional view that the pixel electrode is formed.

FIG. 5 is a cross sectional view that the pixel electrode 12 made of a transparent oxide conductor as e.g. ITO (Indium Tin Oxide) is formed on the polyimide substrate 11. Namely, the ITO is formed by sputtering on the heat resistant polyimide substrate 11, and is patterned. The pixel electrode 12 is patterned as stripe shaped as depicted in FIG. 2 or comb shaped.

Figure 6:
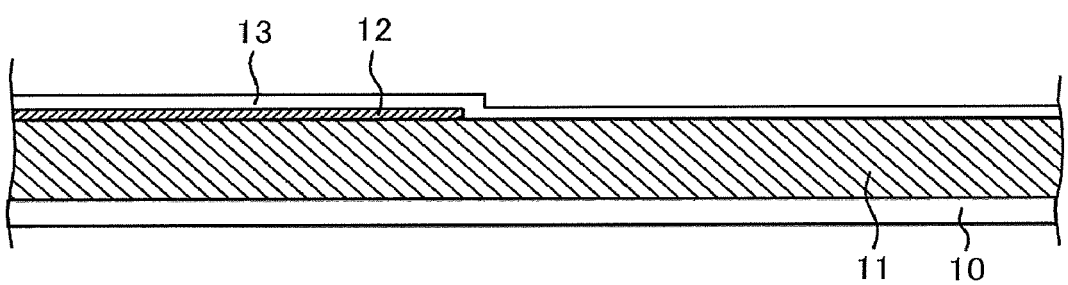
FIG. 6 is a cross sectional view that the capacitive insulating film is formed.

FIG. 6 is a cross sectional view that the capacitive insulating film 13 is formed covering the pixel electrode 12. The capacitive insulating film 13 is formed by sputtering the silicon nitride (SiN) or by CVD (Chemical Vapor Deposition). The thickness of the capacitive insulating film is 70 nm to 150 nm, approximately.

Figure 7:
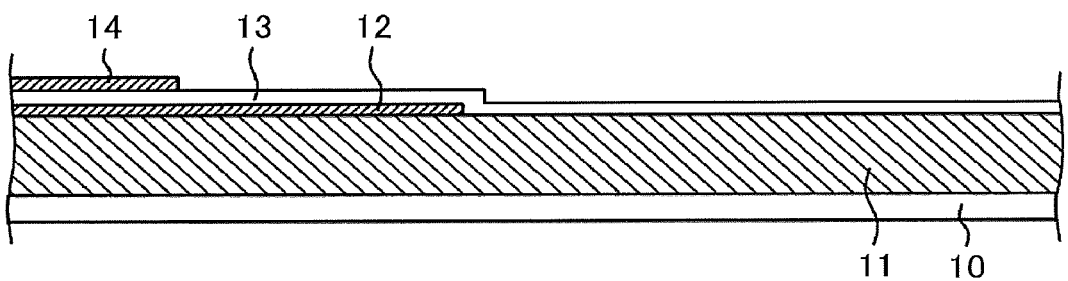
FIG. 7 is a cross sectional view that the common electrode is formed.

FIG. 7 is a cross sectional view that the common electrode 14, made of a transparent oxide conductor as e.g. ITO, is formed on the capacitive insulating film 13. The common electrode 14 is formed in a plane shape in all over the display area except at the through hole, which will be explained later. The pixel capacitance is formed between the common electrode 14 and the pixel electrode 12 sandwiching the capacitive insulating film 13.

Figure 8:
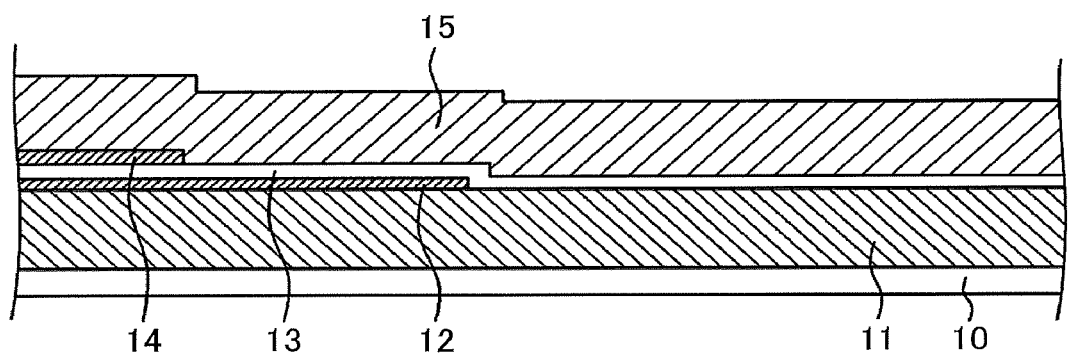
FIG. 8 is a cross sectional view that the first interlayer insulating film is formed.

FIG. 8 is a cross sectional view that the first interlayer insulating film 15 is formed covering the common electrode 14 and the capacitive insulating film 13. The first interlayer insulating film 15 is made of silicon oxide (SiO) or silicon nitride (SiN), or by a laminated film of a SiO film and a SiN film. The first interlayer insulating film 15 is formed by CVD.

Figure 9:
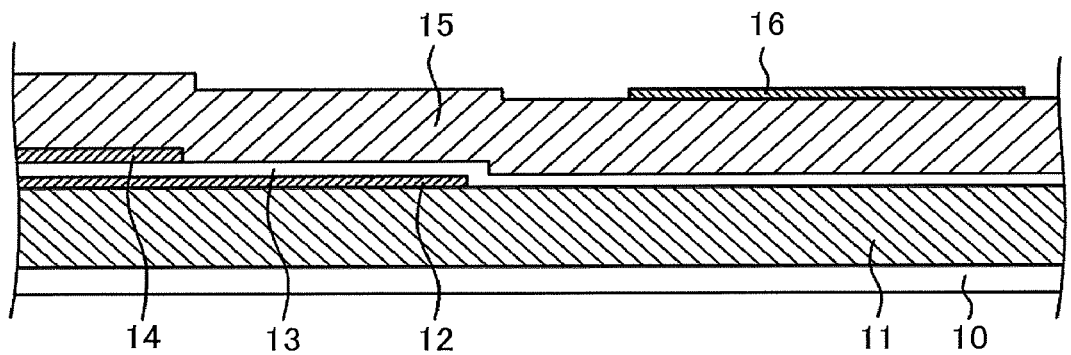
FIG. 9 is a cross sectional view that the LTPS is formed.

FIG. 9 is a cross sectional view that the LTPS 16, which is an active layer (semiconductor layer) of the TFT, is formed on the first interlayer insulating film 15. The LTPS 16 is formed as follows. First, a-Si formed by CVD, is annealed at a temperature of 400 centigrade to 450 centigrade for dehydrogenation. After that, the excimer laser is applied to the a-Si to transform the a-Si to the poly-Si; subsequently, the poly-Si is patterned.

The patterning of the LTPS 16 is made by dry etching after the lithography. The a-Si is annealed before it is transformed to the poly-Si; it is annealed at 400 centigrade to 450 centigrade for dehydrogenation; however, the provisional substrate of heat resistant polyimide 11 can endure the temperature up to 450 centigrade.

Figure 10:
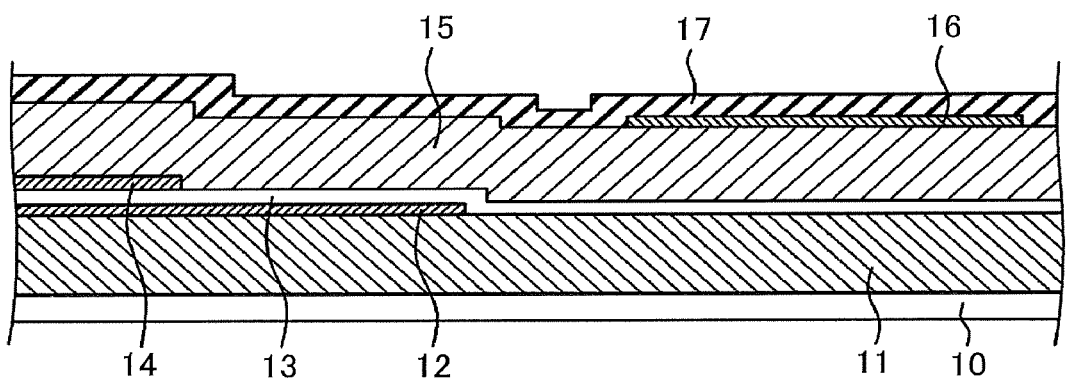
FIG. 10 is a cross sectional view that the gate insulating film is formed.

FIG. 10 is a cross sectional view that the gate insulating film 17 made of SiO is formed by TEOS (Tetraethyl orthosilicate) as the material.

Figure 11:
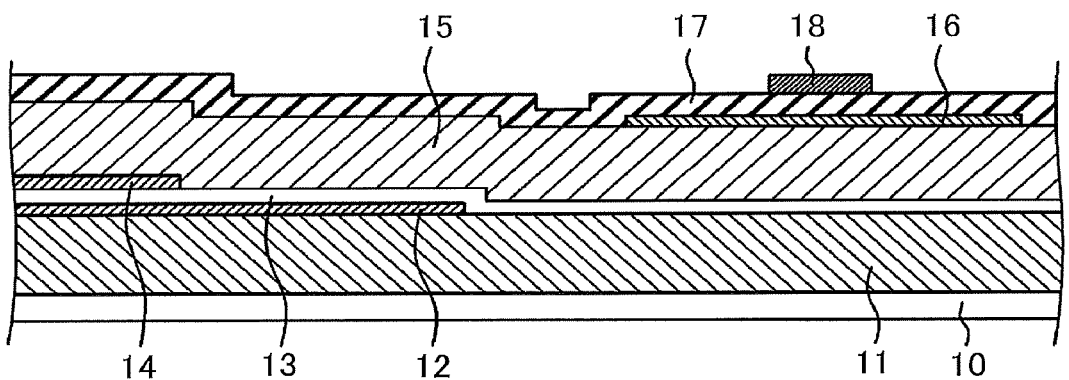
FIG. 11 is a cross sectional view that the gate electrode is formed.

FIG. 11 is a cross sectional view that the gate electrode 18 is formed on the gate insulating film 17. The gate electrode 18 is formed by Mo, W, Al, Ti or alloys of those metals, then patterned. After the gate electrode 18 is patterned, phosphorous (P) or Boron (B), etc. are doped by the ion implantation to the LTPS 16 using the gate electrode 18 as the mask to give the LTPS 16 conductivity. After the ion implantation is made, activating anneal is made at 450 centigrade, 1 hour, to the LTPS 16 so that it can recover the damages, which were made during the ion implantation.

Figure 12:
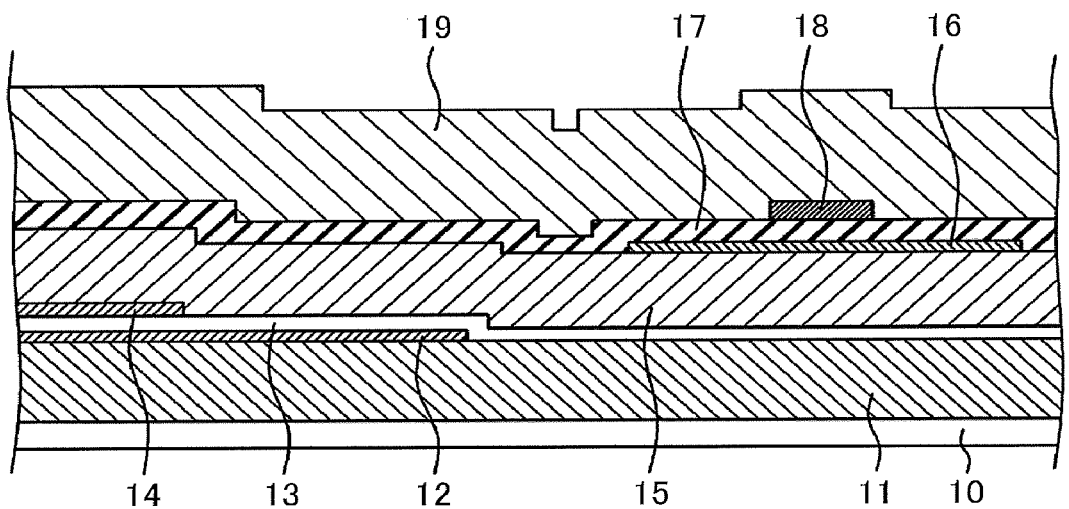
FIG. 12 is a cross sectional view that the second interlayer insulating film is formed.

FIG. 12 is a cross sectional view that the second interlayer insulating film 19 is formed covering the gate electrode 18. The second interlayer insulating film 19 is made of silicon oxide (SiO) or silicon nitride (SiN), or by a laminated film of a SiO film and a SiN film. After the second interlayer insulating film 19 is formed, the termination anneal, which terminates the LTPS 16 by hydrogen, is made at 400 centigrade to 450 centigrade, for approximately 10 minutes. As described above, the LTPS 16 frequently experiences high temperature up to 450 centigrade in the process; in this invention, however, uses the heat resistant polyimide 11 in the process, thus, it can endure the high temperatures.

Figure 13:
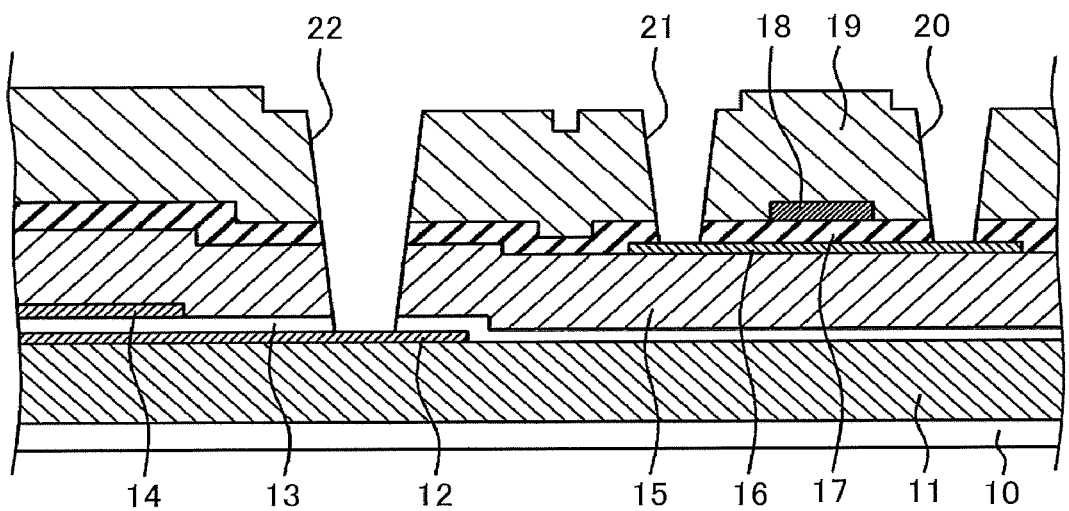
FIG. 13 is a cross sectional view that the through holes are formed.

FIG. 13 is a cross sectional view that the through hole 20 for connection between the drain electrode 23 and the LTPS 16, the through hole 21 for connection between the source electrode 24 and the LTPS 16, and the through hole 22 for the connection between the source electrode 24 and the pixel electrode 12 are formed.

Figure 14:
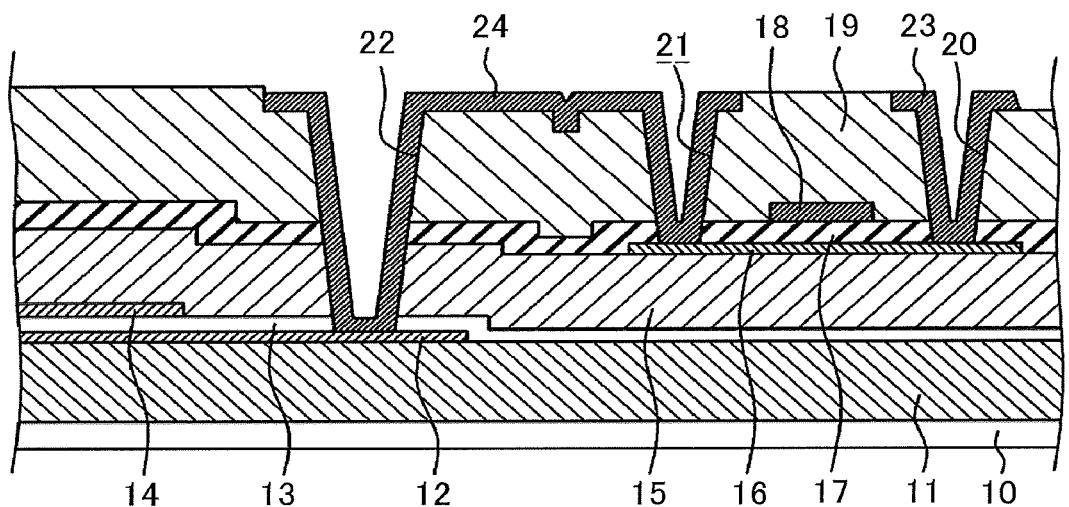
FIG. 14 is a cross sectional view that the source electrode and the drain electrode are formed.

FIG. 14 is a cross sectional view that the drain electrode 23 is formed in the through hole 20, and the source electrode 24 is formed in the through hole 21 and in the through hole 22. The drain electrode 23 and the source electrode 24 are made of Aluminum (Al), Titan (Ti) or alloys of those metals. One example of the structure is that Al is sandwiched by Ti.

Figure 15:
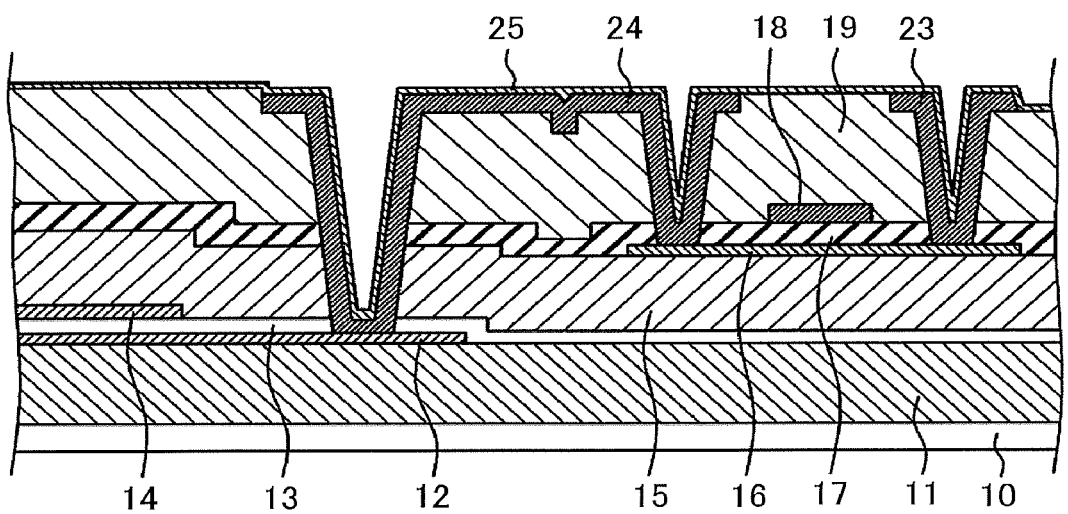
FIG. 15 is a cross sectional view that the barrier film is formed.

FIG. 15 is a cross sectional view that the barrier film 25 is formed covering the drain electrode 23, source electrode 24 and the second interlayer insulating film 19. The barrier film 25 protects LTPS 16 so that it is not contaminated by impurities. The barrier film 25 is made of SiN or Aluminum oxide (AlOx), etc. It may be formed by a laminated film of the SiN film and the SiO film, or a laminated film of the AlOx film and the SiO film.

Figure 16:
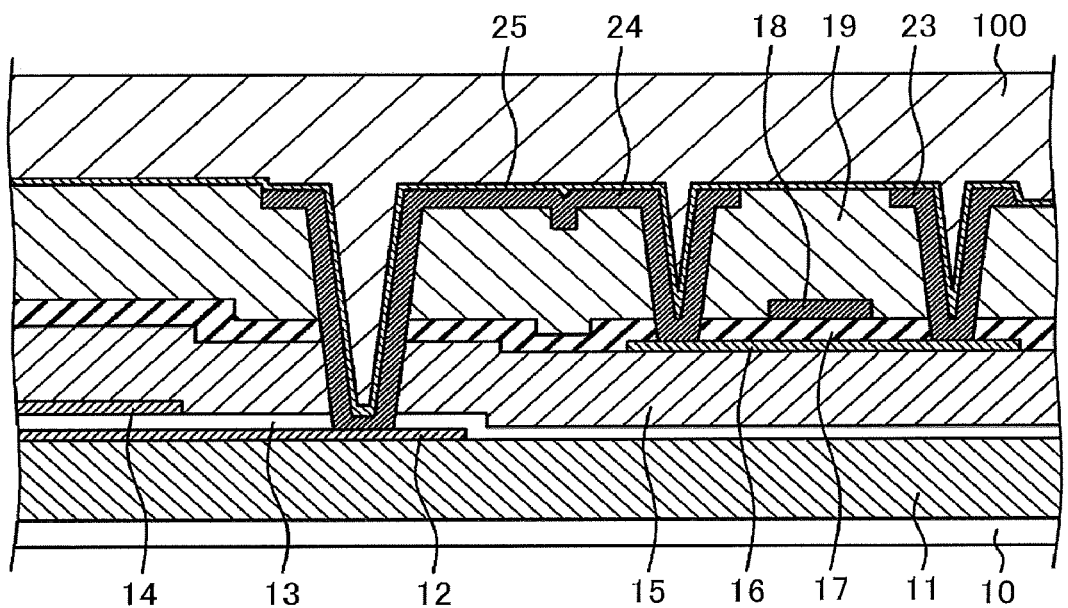
FIG. 16 is a cross sectional view that the transparent polyimide substrate is formed.

FIG. 16 is a cross sectional view the transparent polyimide substrate 100, which is to be the TFT substrate 100, is formed covering the barrier film 25. The material for the transparent polyimide substrate 100 is coated on the barrier film by e.g. slit coater, subsequently, it is baked. The heat resistivity of the transparent polyimide is approximately 350 centigrade; however, since there is no high temperature process like annealing of the LTPS 16 after the transparent polyimide substrate 100, the problem regarding the heat resistivity of the substrate doesn't arise, and the transparency of the substrate can be maintained, too.

There are cases that the plastic substrate 101 is formed on the transparent polyimide substrate 100, or it is not formed. When the plastic substrate 101 is formed, the thickness of the transparent polyimide substrate 100 can be 2-3 micron. When the plastic substrate 101 is not formed, the thickness of the transparent polyimide substrate 100 is approximately 20 micron. In this embodiment, the plastic substrate 101 is formed.

Figure 17:
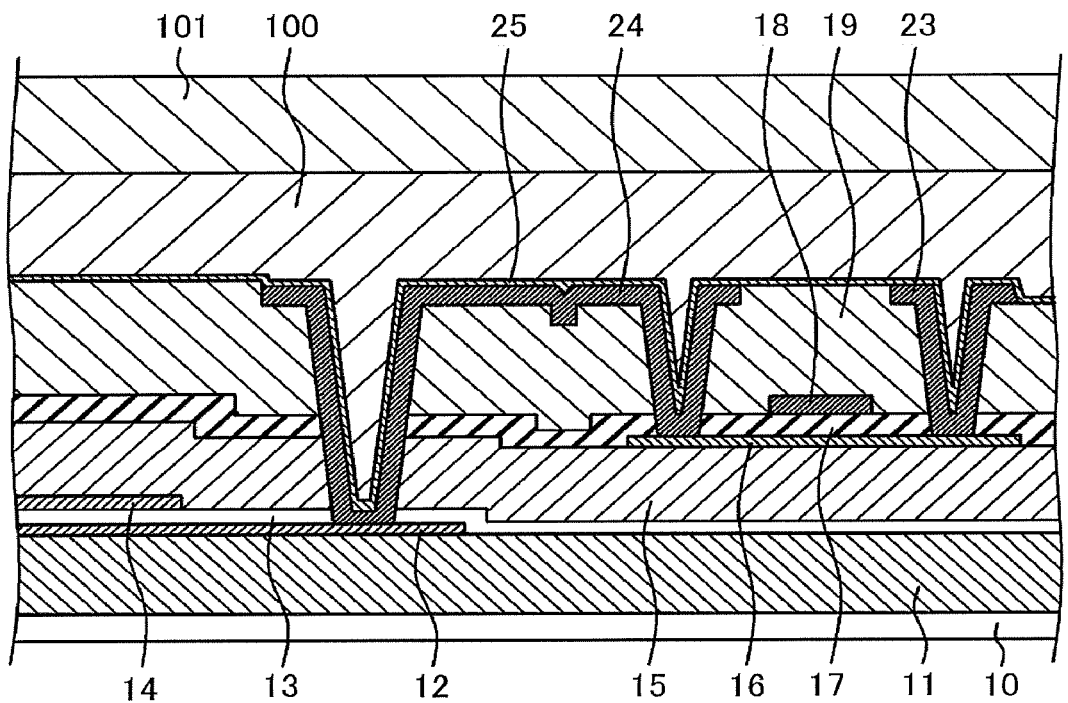
FIG. 17 is a cross sectional view that the transparent plastic substrate is formed.

FIG. 17 is a cross sectional view that the plastic substrate 101 is formed on the transparent polyimide substrate 100. The plastic substrate 101 has a role as a support substrate, thus, it is as thick as 0.5 mm. In the meantime, the thickness of the plastic substrate 101 can be chosen according to a required flexibility of the display device. The plastic substrate 101 is made of a transparent resin, like PET, acrylic, etc. and attached on the transparent polyimide substrate 100 via the adhesive.

In the liquid crystal display device, the lower polarizing plate is adhered to the rear surface of the TFT substrate 100, and the upper polarizing plate is adhered to the front surface of the counter substrate 200. The lower polarizing plate can work as the supporting plate in some products.

Figure 18:
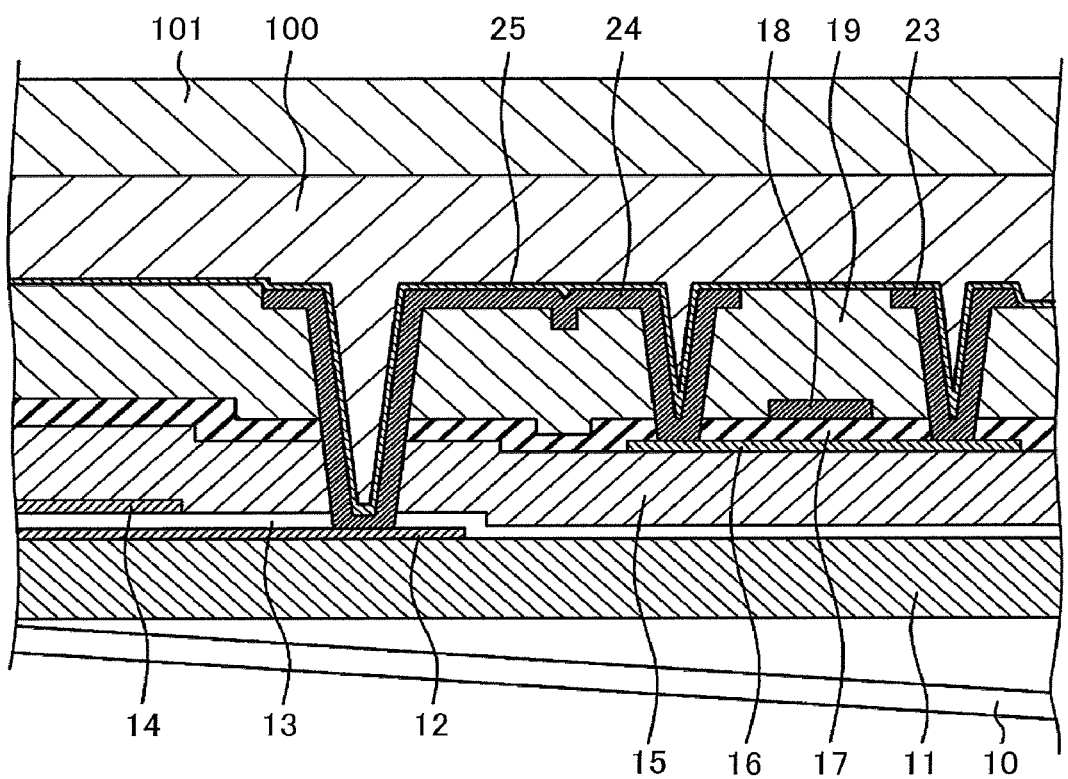
FIG. 18 is a cross sectional view that the glass substrate is being removed.

The glass substrate 10 and the heat resistant polyimide substrate 11 is used to form necessary elements on the TFT substrate 100 in the manufacturing process; thus, they are removed after the necessary elements are formed on the TFT substrate 100. FIG. 18 is a cross sectional view that the glass substrate 10 is being removed. The glass substrate 10 is removed from the heat resistant polyimide 11 by laser ablation, in which the laser is applied at the interface between the glass substrate 10 and the heat resistant polyimide 11.

Figure 19:
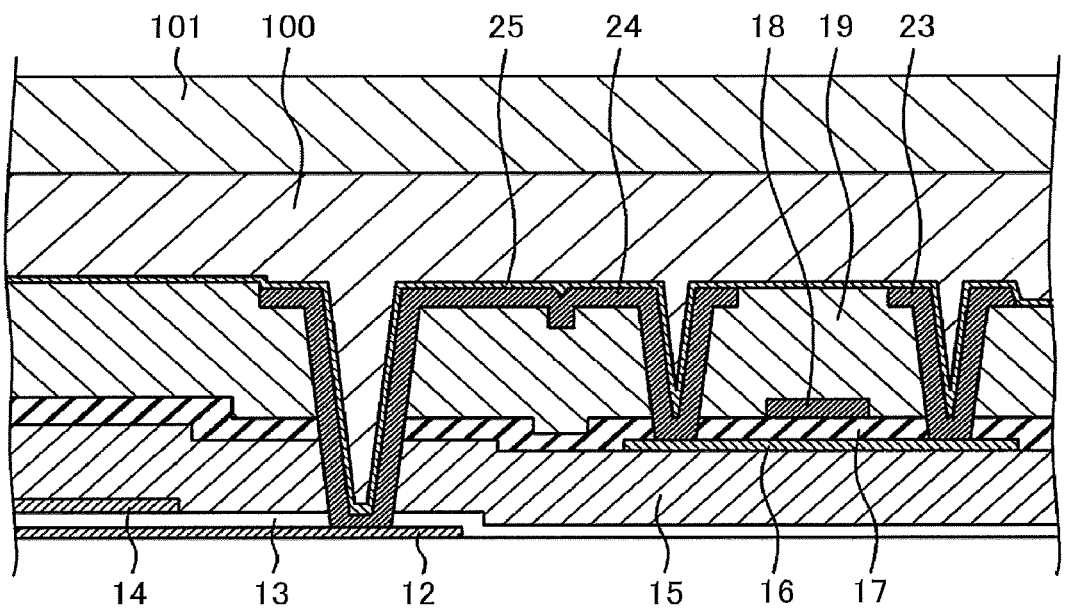
FIG. 19 is a cross sectional view that the heat resistant polyimide substrate is removed.

FIG. 19 is a cross sectional view that the heat resistant polyimide 11 is removed after the glass substrate 10 is removed. Since the thickness of the heat resistant polyimide 11 is approximately 2 micron, is can be removed by e.g. plasma ashing. Additional merit is that the surface of exposed layer can be cleaned by the plasma ashing. At this stage, the transparent polyimide formed on the barrier film 25 becomes the TFT substrate 100.

In this embodiment, the heat resistant polyimide 11 is formed on the glass substrate 10, then, necessary layers are laminated on the heat resistant polyimide substrate 11 to form the element on the TFT substrate; however, the both of the glass substrate 10 and the heat resistant polyimide substrate 11 are removed finally. Therefore, as far as heat resistivity is satisfied, other materials than the heat resistant polyimide can be utilized; further, in some cases, the heat resistant polyimide 11 can be omitted.

Figure 20:
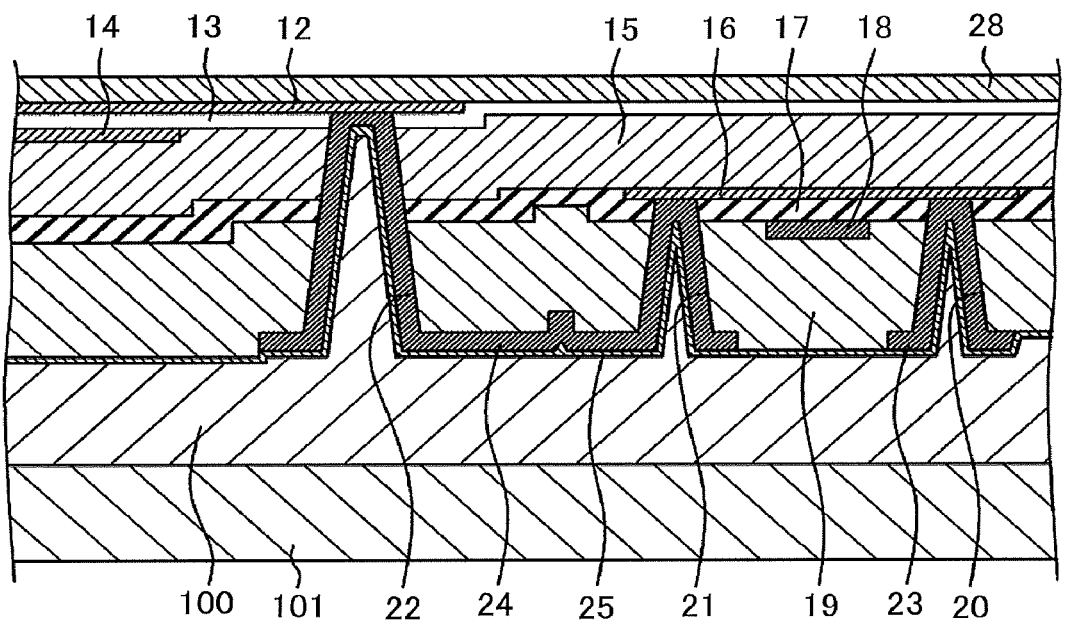
FIG. 20 is a cross sectional view that the alignment film is formed on the pixel electrode.

FIG. 20 is cross sectional view that: the structure of FIG. 19 is reversed in upside down, then, the alignment film 28 is formed on the pixel electrode 12 and the capacitive insulating film 13. The alignment film 28 is made of polyimide. The alignment film experiences an alignment process for initial alignment of the liquid crystal molecules either by rubbing or by optical alignment using the ultra violet ray. In the present invention, the alignment film 28 is formed on the flat surface, it can effectively control the directions of the liquid crystal molecules, further, a variation of the alignment of the liquid crystal molecules due to the surface roughness can be suppressed.

FIG. 20 shows a complete structure of the TFT substrate 100. After that, as depicted in FIG. 3, the counter substrate 200, which is formed separately, is attached to the TFT substrate, sandwiching the liquid crystal; as a result, the liquid crystal panel is completed. The features of the present invention depicted in FIG. 20 are as follows.

(1) The pixel electrode 12 and the source electrode 24 are connected via the through hole 22; the feature is that the source electrode 24 is nearer to the TFT substrate 100 than the pixel electrode 12 is. In addition, the drain electrode 23, which connects with the LTPS 16, is nearer to the TFT substrate 100 than the LTPS 16 is.

(2) No organic flattening film exists; thus, a through hole in the organic flattening film is not necessary. Generally, the organic flattening film is as thick as 2 micron to 4 micron; thus, the through hole becomes bigger, consequently, the transmittance of the pixel decreases. In the present invention, there is no through hole formed in the organic passivation film, thus, the transmittance can be increased.

(3) In FIG. 20, since the gate electrode 18 has a role of light shielding film, additional formation of the light shielding film is not necessary.

(4) The alignment film 28 is not formed in a recess of the through hole since the openings of the through holes are formed in a reverse side of the surface. Thus, a problem of uneven coating of the material for the alignment film 28 caused by a recess of the through hole doesn't occur.

(5) The through holes 20, 21, 22 in FIG. 20 are reverse tapered when the TFT substrate 100 is defined to be in a lower side. The reverse taper means that a diameter of the lower side is wider than the diameter of the upper side in the through hole. The reason is that the elements on the TFT substrate 100 are formed upside down during the manufacturing processes.

As described above, in the present invention, the transparent polyimide substrate 100 is not yet formed when the LTPS 16 is annealed. The annealing of the LTPS 16 is made on the heat resistant polyimide 11, thus, high enough temperature can be applied. Therefore, the TFT of high reliability can be formed, consequently, the flexible display device that can display high quality images can be realized.

Second Embodiment

The TFT substrate is formed through many photography processes; thus, mask alignments are necessary in many processes. In the first embodiment, the alignment mark for the mask alignment is formed by ITO that forms pixel electrode 12; however, since ITO is transparent, sometimes it is difficult to recognize the alignment mark. In the present embodiment, the alignment mark 30 made of metal is formed before the pixel electrode 12 made of ITO is formed.

Figure 21:
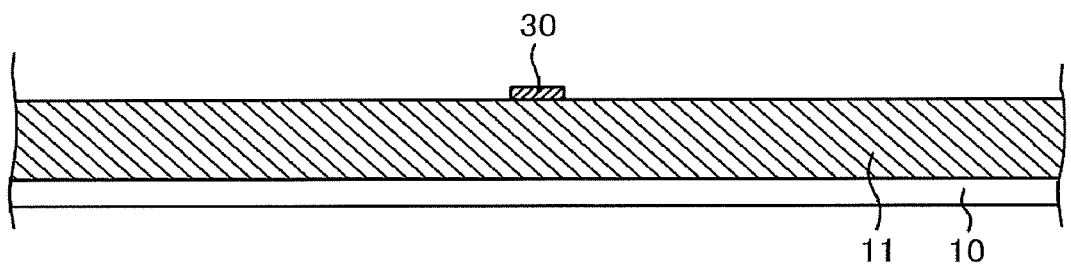
FIG. 21 is a cross sectional view that the alignment mark is formed on the heat resistant polyimide substrate.

FIG. 21 is a cross sectional view that the heat resistant polyimide 11 is formed on the glass substrate 10, after that, the alignment mark 30 made of metal is formed. The alignment mark 30 can be any material as far as it is metal. For example, either one of Mo, W, Al, Ti, and so on, which are used for the gate electrode, is formed by sputtering and then patterned.

Figure 22:
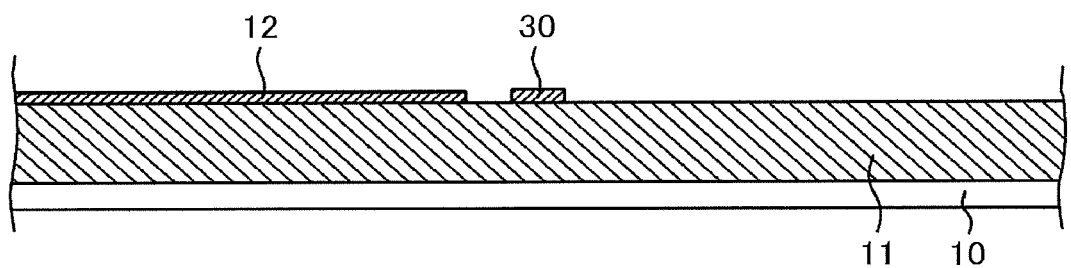
FIG. 22 is a cross sectional view that the pixel electrode is formed.
Figure 23:
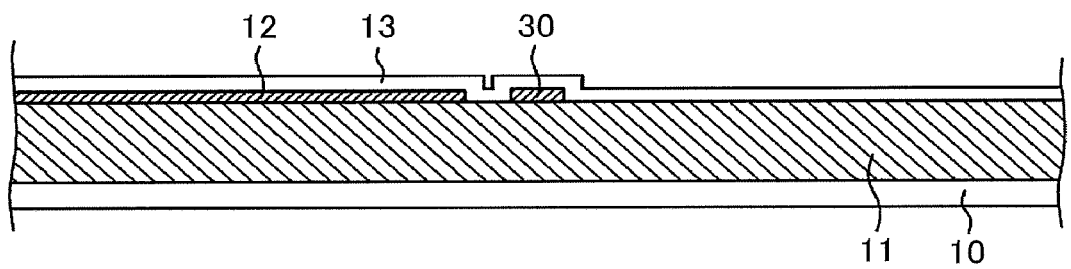
FIG. 23 is a cross sectional view that the capacitive insulating film is formed.

After that, as depicted in FIG. 22, the pixel electrode 12 is formed. After that, as depicted in FIG. 23, the capacitive insulating film 13 is formed. The subsequent processes are the same as explained in the first embodiment, thus, an explanation is omitted.

Third Embodiment

The LTPS has high mobility, thus, it is suitable to form a driving circuits when it is formed by TFT. On the other hand, since the LTPS has rather higher leak current, sometimes the LTPS may not be enough when it is used as a switching element in the pixel. The oxide semiconductor has low leak current, thus, it is suitable for the switching TFT in the pixel.

The oxide semiconductor can be formed at about 350 centigrade, which is rather low process temperature; however, to acquire stable characteristics in the oxide semiconductor, it is preferable that annealing temperature is raised up to a temperature of around 450 centigrade. The present invention enables to realize this process.

Figure 24:
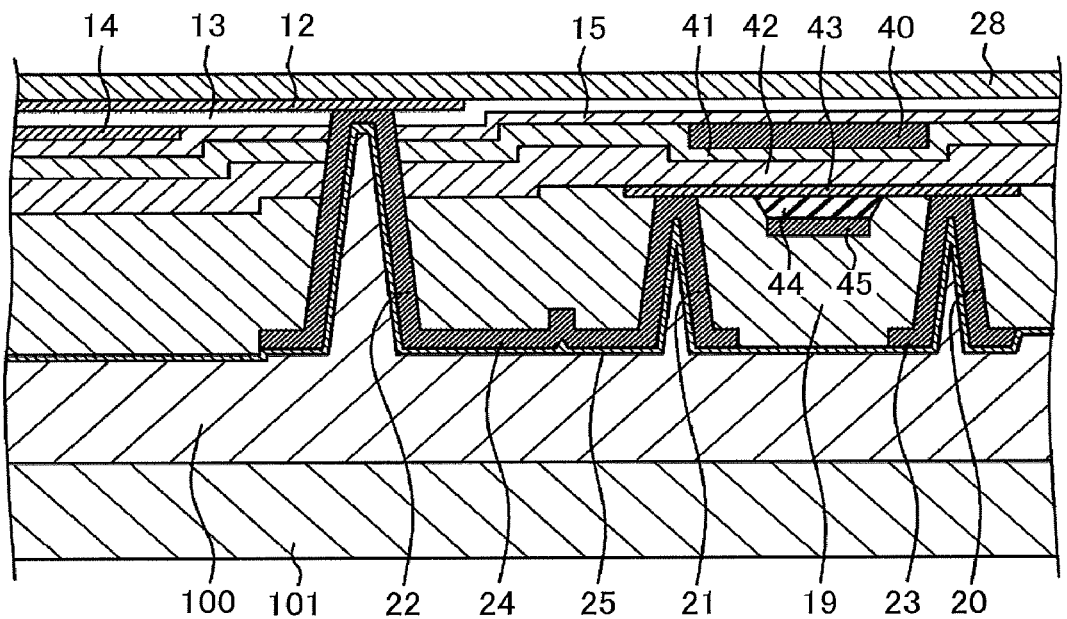
FIG. 24 is a cross sectional view of third embodiment.

FIG. 24 is a cross sectional view of the structure of the TFT substrate 100 having the TFT formed by the oxide semiconductor 43. In the meantime, the structure of the counter substrate 200 is the same as explained in the first embodiment. In FIG. 24, the TFT of the oxide semiconductor 43 is a dual gate type, which the gate electrode is formed at both of the upper side and the lower side of the semiconductor layer. The present invention is, however, applicable to a single gate type TFT, which gate electrode is formed either at upper side or lower side of the semiconductor layer.

Figure 25:
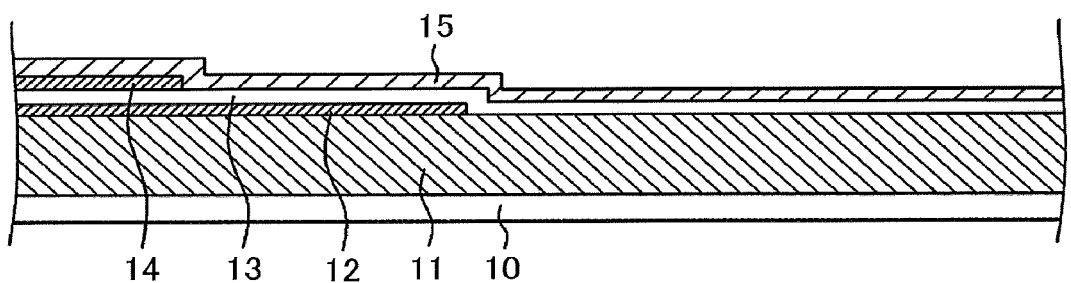
FIG. 25 is a cross sectional view that films, up to the first interlayer insulating films, are formed in third embodiment.

FIGS. 25-29 are cross sections of the display in the processes to realize the structure of FIG. 24. FIG. 25 is a cross sectional view that up to the first interlayer insulating film 15 is formed. The manufacturing method of each of the layers is the same as explained in the first embodiment. In the meantime, the first interlayer insulating film 15 in FIG. 25 can be eliminated; namely, the gate electrode 40, which is formed subsequently, can be formed directly on the capacitive insulating film 13.

Figure 26:
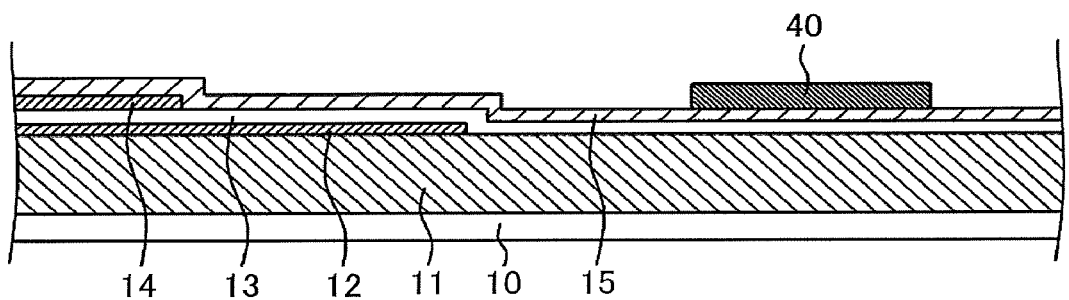
FIG. 26 is a cross sectional view that the first gate electrode is formed.

FIG. 26 is a cross sectional view that the first gate electrode 40 is formed on the first interlayer insulating film 15. The first gate electrode 40 is formed as that: Mo, W, Al, Ti, or alloys of those metals are formed by sputtering and then patterned.

Figure 27:
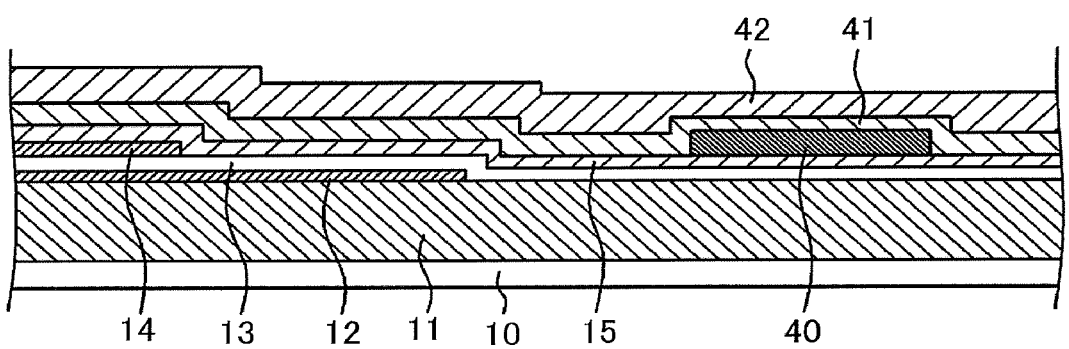
FIG. 27 is a cross sectional view that the first gate insulating film and the second gate insulating film are formed.

FIG. 27 is a cross sectional view that the gate insulating film 41, 42 are formed covering the first gate electrode 40. The gate insulating film is a two layer structure that the first gate insulating layer 41, which is lower side, is made of SiN; the second gate insulating film 42, which is upper side, is made of SiO. The oxide semiconductor 43 is formed on the second gate insulating film 42, thus, the upper layer, the second gate insulating film 42, is made of SiO so that the second gate insulating film 42 doesn't reduce the oxide semiconductor.

Figure 28:
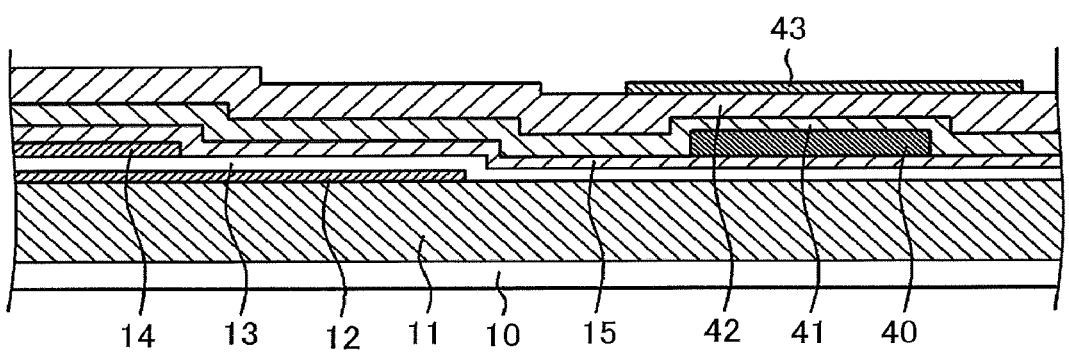
FIG. 28 is a cross sectional view that the oxide semiconductor is formed.

FIG. 28 is a cross sectional view that the oxide semiconductor 43 as e.g. IGZO is formed on the second gate insulating film 42. The oxide semiconductor 43 is formed e.g. by sputtering and patterned. The thickness of the oxide semiconductor 43 is e.g. 10 nm to 100 nm.

Figure 29:
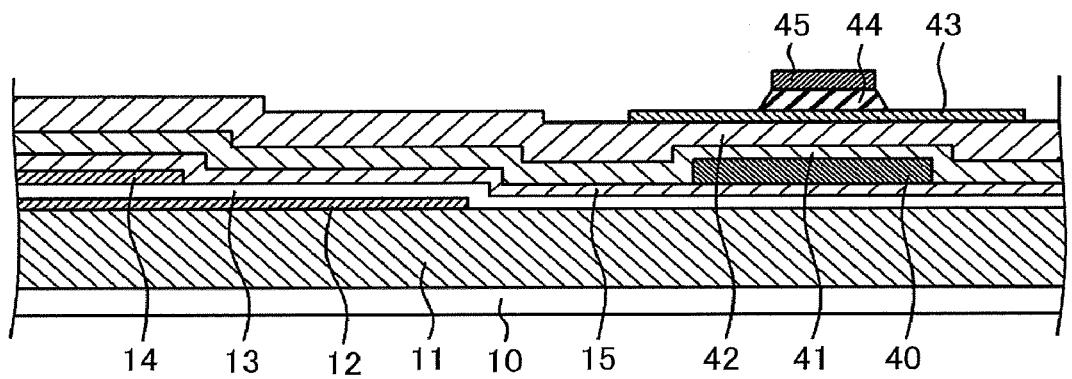
FIG. 29 is a cross sectional view that the third gate insulating film and the second gate electrode are formed.

FIG. 29 is a cross sectional view that the third gate insulating film 44 and the second gate electrode 45 are formed on the oxide semiconductor 43. After the third gate insulating film 44 is formed, the second gate electrode 45 is formed by e.g. sputtering. Both of the second gate electrode 45 and the first gate electrode 40 can be made of the same metals or alloys. After the second gate electrode 45 is patterned, the third gate insulating film 44 is patterned continuously. The third gate insulating film 44 can be patterned using the second gate electrode 45 as the mask.

In the oxide semiconductor 43, the portion, on which the third gate insulating film 44 is formed, is a channel portion. The third gate insulating film 44 is formed by e.g. oxygen rich SiO film to supply oxygen to the oxide semiconductor 43.

After that, the oxide semiconductor 43 is annealed at the temperature of 300 degree to 400 degree to stabilize the characteristics of the channel. Since the heat resistant polyimide 11 is used in the present invention, the anneal temperature can be raised up to 300 centigrade to 400 centigrade; thus, characteristics of the TFT can be stabilized.

Figure 30:
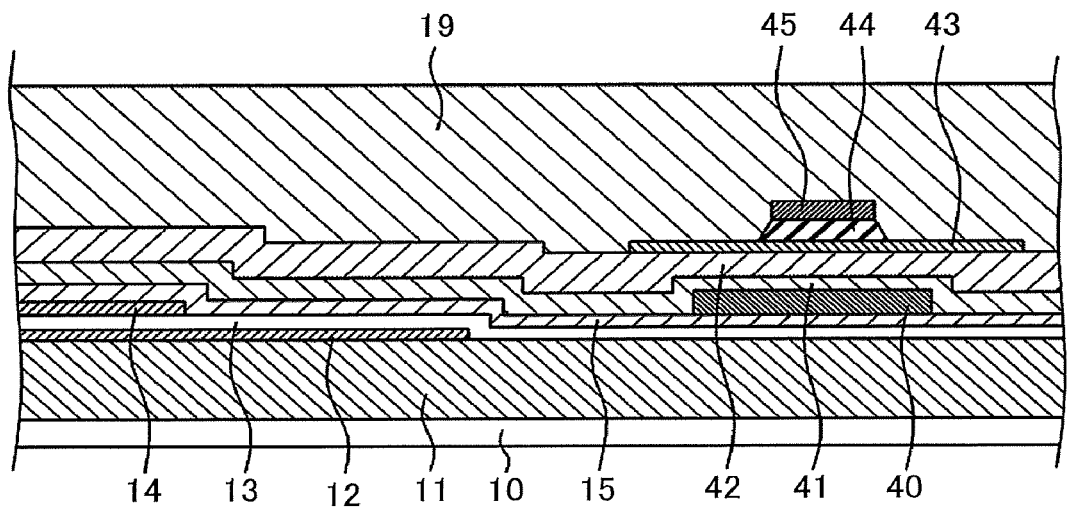
FIG. 30 is a cross sectional view that the second interlayer insulating film is formed.

FIG. 30 is a cross sectional view that the second interlayer insulating film 19 is formed covering the second gate electrode 45 and the oxide semiconductor 43. The second interlayer insulating film 19 is made of SiO or SiN, or laminated film of the SiO film and the SiN film. The following processes are the same as explained in the first embodiment, thus, explanations are omitted.

The present embodiment depicted in FIG. 24 has the same characteristics explained in FIG. 20 of the first embodiment.

Fourth Embodiment

Figure 31:
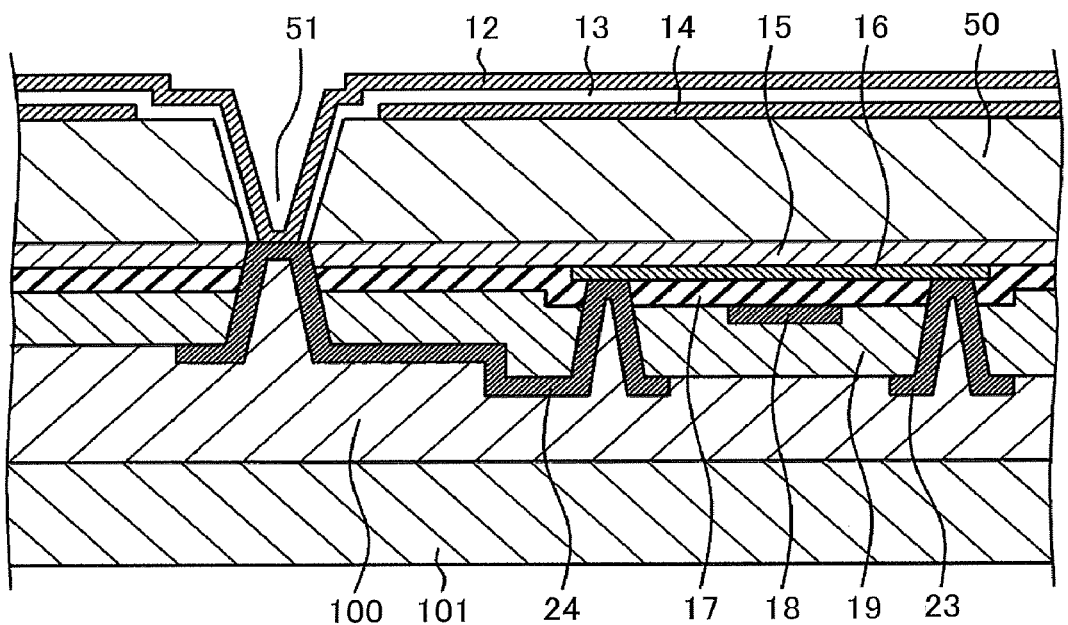
FIG. 31 is a plan view of fourth embodiment.

FIG. 31 is a cross sectional view of the TFT substrate in the fourth embodiment of the present invention. FIG. 31 differs from the first embodiment in that the pixel electrode 12 and the common electrode 14 are formed after the glass substrate 10 and the heat resistant polyimide 11 are removed. FIGS. 32-37 are the cross sectional view of the display device in a process that realizes the structure of FIG. 31.

Figure 32:
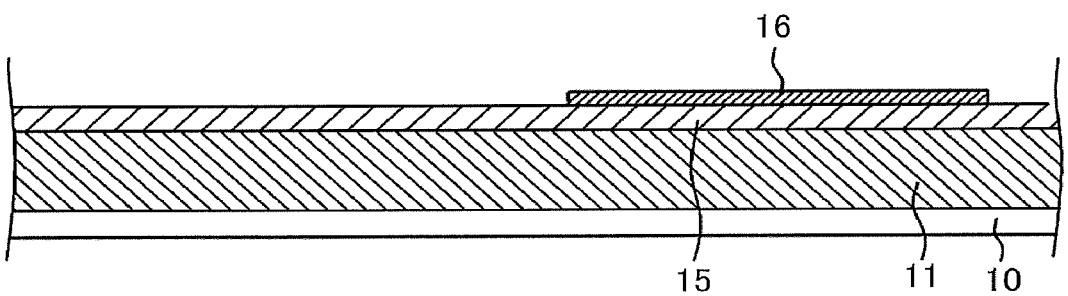
FIG. 32 is a cross sectional view that the first interlayer insulating film and the LTPS are formed on the heat resistant polyimide substrate.

FIG. 32 is a cross sectional view that the heat resistant polyimide 11 is formed on the glass substrate 10; the first interlayer insulating film 15 is formed on the heat resistant polyimide 11; the LTPS 16 is formed on the first interlayer insulating film 15. FIG. 32 differs from the embodiment 1 is that the first interlayer insulating film 15 is directly formed on the heat resistant polyimide 11 without forming: the pixel electrode, the capacitive insulating film and the common electrode. The manufacturing method of the first interlayer insulating film 15 and the LTPS 16 are the same as explained in the first embodiment. Namely, the dehydrogenation annealing is applied at a temperature of 400 centigrade to 450 centigrade before the a-Si is transformed to the poly-Si; however, at this point, the heat resistant polyimide is used, thus, the problem regarding heat resistivity doesn't occur.

Figure 33:
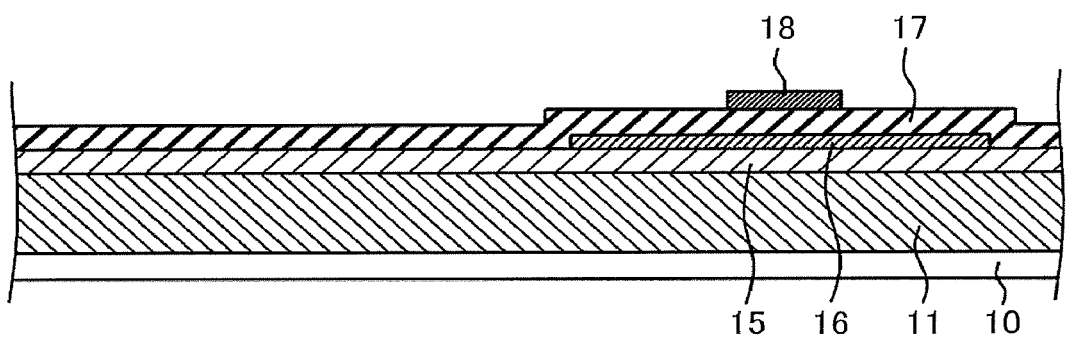
FIG. 33 is a cross sectional view that the gate insulating film and the gate electrode are formed covering the LTPS.

FIG. 33 is cross sectional view that the gate insulating film 17 and the gate electrode 18 are formed on the LTPS 16. Manufacturing methods of the gate insulating film 17 and the gate electrode 18 are the same as explained in the first embodiment. The activation annealing is applied to the LTPS 16 at a temperature of 400 centigrade to 450 centigrade; however, at this point, the heat resistant polyimide substrate 11 is used, thus, the problem regarding heat resistivity doesn't occur.

Figure 34:
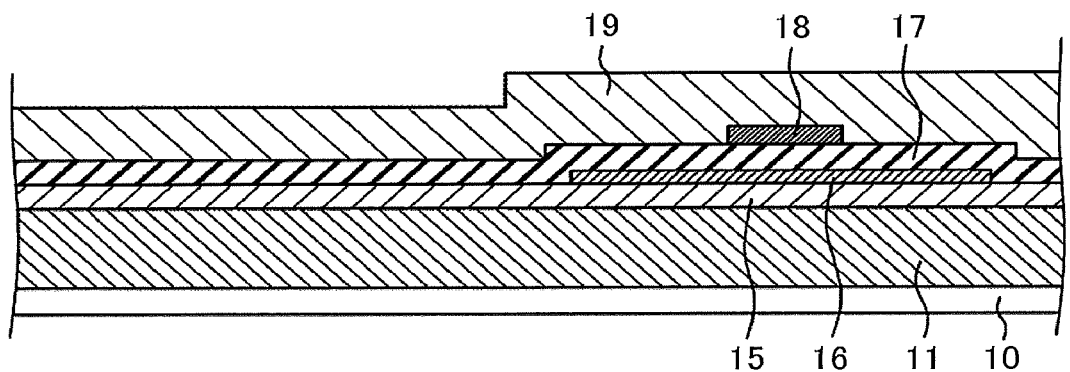
FIG. 34 is a cross sectional view that the second interlayer insulating film is formed.

FIG. 34 is a cross sectional view that the second interlayer insulating film 19 is formed covering the gate electrode 18 and the LTPS 16. The second interlayer insulating film 19 is formed as the manner explained in the first embodiment. The hydrogen termination annealing is applied to the LTPS 16 at a temperature of 400 centigrade to 450 centigrade; however, at this point, the heat resistant polyimide substrate 11 is used, thus, the problem regarding heat resistivity doesn't occur.

Figure 35:
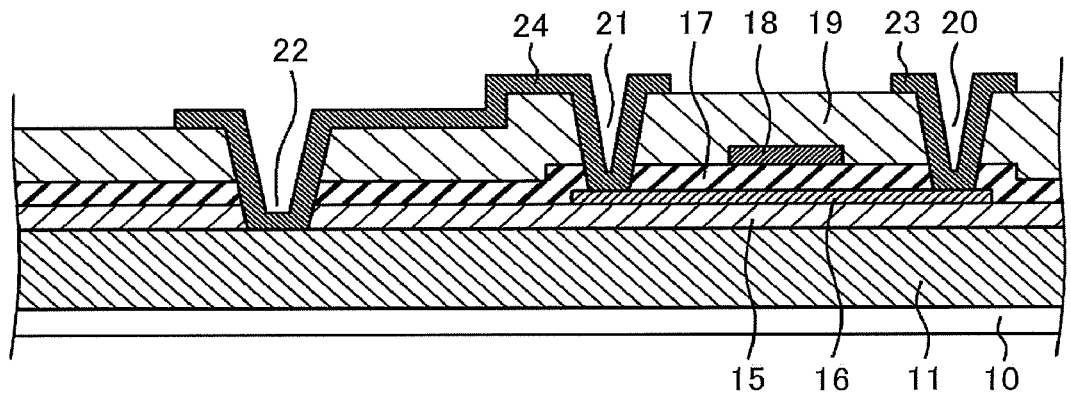
FIG. 35 is a cross sectional view that the source electrode and the drain electrode are formed.

FIG. 35 is a cross sectional view that through holes 20, 21, 22 are formed in the second interlayer insulating film 19, gate insulating film 18, and the first interlayer insulating film 15; and then, drain electrode 23 and the source electrode 24 are formed. Manufacturing process of through holes 20, 21, 22 and the drain electrode 23 and source electrode 24 are the same as explained in the first embodiment.

Figure 36:
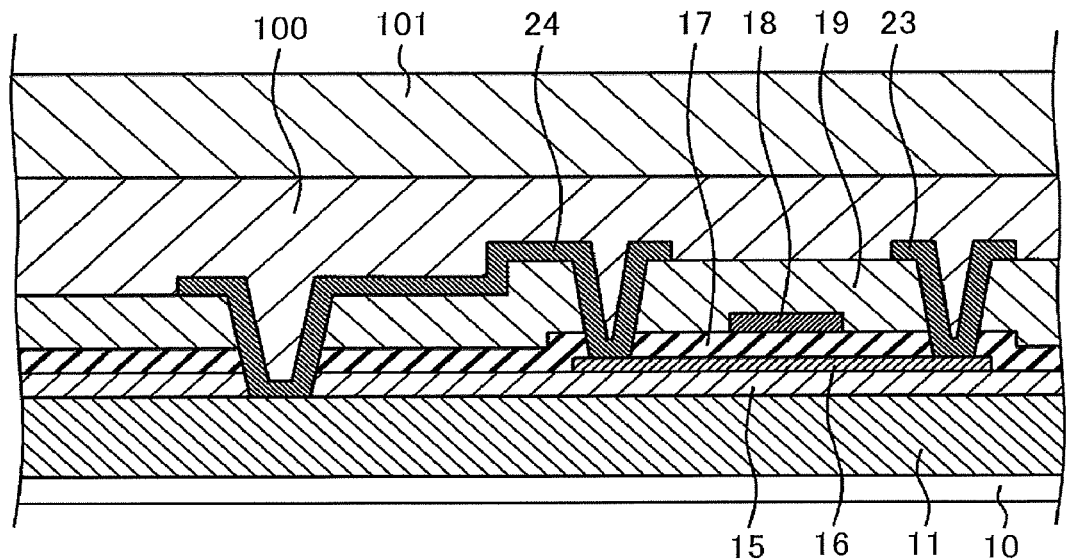
FIG. 36 is a cross sectional view that the transparent polyimide substrate and the plastic substrate are formed.

FIG. 36 is a cross sectional view that the transparent polyimide, which is to be the TFT substrate 100, is formed covering the second interlayer insulating film 19; and the plastic substrate 101 is adhered to the transparent polyimide substrate 100 via adhesive. In FIG. 36, a barrier film, which is to cover the drain electrode 23, the source electrode 24, the second interlayer insulating film 19, and etc. doesn't exist; however, it can be formed according to necessity. The transparent polyimide substrate 100 and the plastic substrate 101 are the same as explained in the first embodiment.

Figure 37:
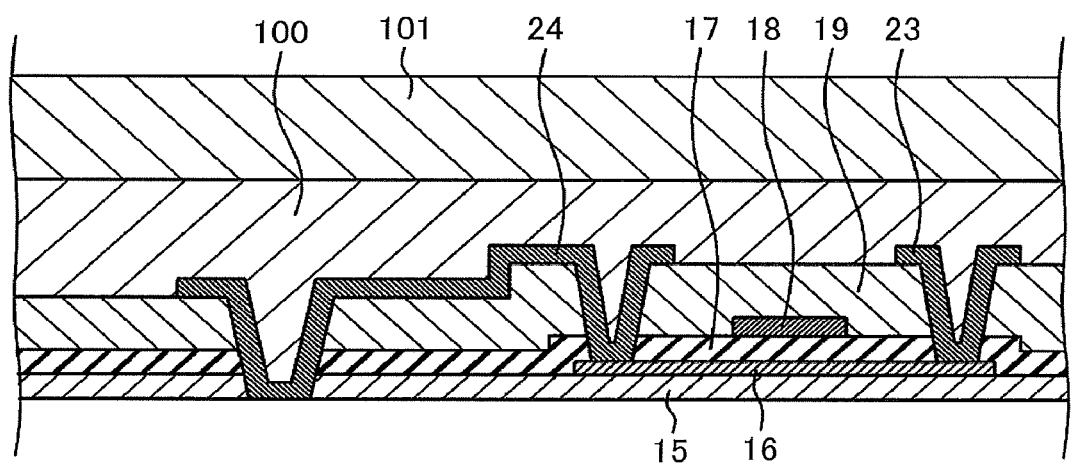
FIG. 37 is a cross sectional view that the glass substrate and the heat resistant polyimide substrate are removed.

FIG. 37 is a cross sectional view that the glass substrate 10 and the heat resistant polyimide substrate 11 is removed from the structure of FIG. 36. Removing process of the glass substrate 10 and the heat resistant polyimide substrate 11 is the same as explained in the first embodiment. At this stage, the first interlayer insulating film 15 and the source electrode 24, which is formed in the through hole 22 in the first interlayer insulating film 15, are exposed as a surface.

After that, as depicted in FIG. 31, the organic passivation film 50 is formed on the first interlayer insulating film 15; the through hole 51 is formed in the organic passivation film 50 at a position corresponding to the source electrode 24. The thickness of the organic passivation film 50 is 2 micron to 4 micron.

After that, the common electrode 14 made of ITO is formed on the organic passivation film 50; then the capacitive insulating film 13 is formed on the common electrode 14. The pixel electrode 12 made of ITO is formed on the capacitive insulating film 13. Subsequently, the alignment film 12 is formed covering the pixel electrode 12. The TFT substrate is completed at this point.

After that, as described in the first embodiment, the counter substrate, which is formed separately, is attached to the TFT substrate via the sealing material sandwiching the liquid crystal between the TFT substrate and the counter substrate. In this embodiment too, when the annealing processes are applied to the LTPS 16, the LTPS is on the heat resistant polyimide substrate, that is, before the transparent polyimide substrate is formed; thus, high temperature anneal can be applied, consequently, the TFT of high reliability can be realized.

The organic passivation film 50 is used in the fourth embodiment; however, thickness of the organic passivation film 50 is not necessarily thick since the surface of the first interlayer insulating film 15 is flat. The diameter of the through hole 51 can be made small if the organic passivation film 50 is thin. Further, an inorganic passivation film made of SiO or SiN is applicable instead of the organic passivation film 50. In this case, the diameter of the through hole can be further made smaller.

The TFT of the LTPS was explained in the first embodiment and the fourth embodiment; the TFT of the oxide semiconductor was explained in the third embodiment. The LTPS has high mobility, thus, the TFT of the LTPS is suitable for the driving circuits when they are formed by the TFTs. On the other hand, the TFT of the oxide semiconductor has low leak current, thus, it is suitable for a switching TFT in the pixel.

Therefore, it is reasonable to form the TFTs of LTPS in the peripheral driving circuits, and to form the TFTs of the oxide semiconductor in the pixels. It is called hybrid type to form the TFTs of the LTPS and the TFTs of the oxide semiconductor on the same substrate. According to the present invention, as explained in the first embodiment to the fourth embodiment, both of the LTPS and the oxide semiconductor can be made before the transparent polyimide is formed; thus, high temperature process is applicable. Therefore, in the hybrid structure, too, the display of high reliability is realized according to the present invention.

The present invention has been explained in regard to the liquid crystal display device. On the other hand, in the organic EL display device, there are the top emission type and the bottom emission type. In the bottom emission type, the light from the display area transmits through the substrate; thus, the merit of the present invention is enjoyed as that the transparent resin substrate can be used even adopting high temperature processes during the manufacturing process. By the way, generally, the anode for the light emitting layer corresponds to the pixel electrode in the organic EL display device.

In the first embodiment through the third embodiment, the organic passivation film 50 is not necessarily needed. Namely, a big through hole 51 to be formed in the organic passivation film 50 is not necessary. That is to say, if one of the structures of the first embodiment to third embodiment is applied to the top emission type organic EL display device, the pixel size can be made smaller; consequently, a high definition organic EL display device can be realized. Further, in the fourth embodiment, if the thickness of the organic passivation film 50 is made thin, or the inorganic passivation is adopted instead of the organic passivation film, the through holes 51 can be made small; thus, high definition organic EL display device can be realized.

What is claimed is:

1. A display device having a pixel electrode and a TFT including a semiconductor layer on a substrate comprising:
a source region of the semiconductor layer connects with a source electrode, a drain region of the semiconductor layer connects with a drain electrode,
the pixel electrode connects with the source electrode, the drain electrode connects with a video signal line,
a distance between the drain electrode and the substrate is smaller than a distance between the semiconductor layer and the substrate,
the semiconductor layer is formed between the pixel electrode and the substrate,
wherein the drain electrode connects with the semiconductor layer via a first through hole,
the source electrode connects with the semiconductor layer via a second through hole,
the pixel electrode connects with the source electrode via a third through hole,
in the first through hole, a diameter nearer to the substrate is bigger than a diameter nearer to the semiconductor layer,
in the second through hole, a diameter nearer to the substrate is bigger than a diameter nearer to the semiconductor layer,
in the third through hole, a diameter nearer to the substrate is bigger than a diameter nearer to the pixel electrode.

2. The display device according to claim 1,
wherein the semiconductor layer is poly-Si, a gate electrode that constitutes the TFT works as a light shield layer for a channel of the TFT.

3. The display device according to claim 1,
wherein the semiconductor layer is oxide semiconductor, a gate electrode that constitutes the TFT works as a light shield layer for a channel of the TFT.

4. The display device according to claim 1,
wherein the semiconductor layer is oxide semiconductor, the TFT is a dual gate type TFT in that a gate electrode is formed at an upper side and at a lower side of the oxide semiconductor.

5. The display device according to claim 1,
wherein the substrate is made of polyimide.

6. The display device according to claim 1,
wherein the display device is a liquid crystal display device.

7. The display device according to claim 1,
wherein the display device is an organic EL display device.

8. A liquid crystal display device comprising: a first substrate having a pixel electrode and a TFT, and a liquid crystal sandwiched between the first substrate and a second substrate,
wherein an alignment film is formed on a surface that contacts the liquid crystal at each of the first substrate and the second substrate,
the alignment film is not formed in a through hole that connects the pixel electrode and the TFT,
wherein a source of a semiconductor layer connects with a source electrode, a drain of the semiconductor layer connects with a drain electrode, the pixel electrode connects with the source electrode, the drain electrode connects with a video signal line,
a distance between the drain electrode and the substrate is smaller than a distance between the semiconductor layer and the first substrate, and
wherein the drain electrode connects with the semiconductor layer via a first through hole,
the source electrode connects with the semiconductor layer via a second through hole,
the pixel electrode connects with the source electrode via a third through hole,
in the first through hole, a diameter nearer to the first substrate is bigger than a diameter nearer to the semiconductor layer,
in the second through hole, a diameter nearer to the first substrate is bigger than a diameter nearer to the semiconductor layer,
in the third through hole, a diameter nearer to the first substrate is bigger than a diameter nearer to the pixel electrode.

9. The display device according to claim 8,
wherein the TFT includes a semiconductor layer and a gate electrode,
the semiconductor layer is poly-Si, the gate electrode works as a light shield layer for a channel of the TFT.

10. The display device according to claim 8,
wherein the TFT includes a semiconductor layer and a gate electrode, the semiconductor layer is oxide semiconductor, the gate electrode works as a light shield layer for a channel of the TFT.

11. The display device according to claim 8,
wherein the first substrate is made of polyimide.

* * * * *